United States Patent
Nakazumi et al.

(10) Patent No.: US 9,799,510 B2
(45) Date of Patent: Oct. 24, 2017

(54) METHOD FOR PRODUCING METAL OXIDE FILM AND METHOD FOR PRODUCING TRANSISTOR

(71) Applicant: NIKON CORPORATION, Tokyo (JP)

(72) Inventors: Makoto Nakazumi, Yamato (JP); Yasutaka Nishi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/009,248

(22) Filed: Jan. 28, 2016

(65) Prior Publication Data

US 2016/0163538 A1   Jun. 9, 2016

Related U.S. Application Data

(63) Continuation of application No. PCT/JP2014/066130, filed on Jun. 18, 2014.

(30) Foreign Application Priority Data

Aug. 7, 2013 (JP) .................. 2013-164248

(51) Int. Cl.
*H01L 29/51* (2006.01)
*H01L 21/02* (2006.01)
(Continued)

(52) U.S. Cl.
CPC .......... *H01L 21/02178* (2013.01); *C01F 7/02* (2013.01); *C23C 18/125* (2013.01); *C23C 18/1216* (2013.01); *H01L 21/02172* (2013.01); *H01L 21/02205* (2013.01); *H01L 21/02282* (2013.01); *H01L 21/02323* (2013.01);
(Continued)

(58) Field of Classification Search
CPC ............ H01L 29/517; H01L 21/02172; H01L 21/02178; H01L 21/02282; H01L 21/02337
See application file for complete search history.

(56) References Cited

U.S. PATENT DOCUMENTS 4,276,399 A * 6/1981 Rekers ................. B01J 31/0212
526/101
5,234,556 A * 8/1993 Oishi ................... B01J 13/0052
204/157.51
(Continued)

FOREIGN PATENT DOCUMENTS

EP   0 413 564 A2 * 2/1991 ............. C01B 13/32
JP   3-188938      8/1991
(Continued)

OTHER PUBLICATIONS

Nielsen et al., "Preparation of films from aluminum acetylacetonate by plasma sputtering", Surf. Interface Anal., Mar. 2013, vol. 45, pp. 1113-1118.*

(Continued)

*Primary Examiner* — Evan Pert

(57) ABSTRACT

Provided is a technology for efficiently obtaining a metal oxide film having good adhesiveness. A method of producing a metal oxide film includes: an application step of applying a solution containing an organic metal complex onto a substrate; an ozone exposure step of exposing the resultant coating film to ozone; and a heating step of heating the coating film.

7 Claims, 13 Drawing Sheets

(51) Int. Cl.
- H01L 21/311 (2006.01)
- H01L 29/49 (2006.01)
- C23C 18/12 (2006.01)
- C01F 7/02 (2006.01)
- H01L 21/28 (2006.01)
- H01L 29/66 (2006.01)

(52) U.S. Cl.
CPC .. H01L 21/02334 (2013.01); H01L 21/02337 (2013.01); H01L 21/28008 (2013.01); H01L 21/28158 (2013.01); H01L 21/311 (2013.01); H01L 29/4908 (2013.01); H01L 29/517 (2013.01); H01L 29/66477 (2013.01)

(56) References Cited

U.S. PATENT DOCUMENTS

| | | | | |
|---|---|---|---|---|
| 7,595,414 | B2* | 9/2009 | Kadota | C07C 45/455 427/248.1 |
| 8,114,704 | B2* | 2/2012 | Kim | H01L 51/0533 257/40 |
| 8,304,083 | B2* | 11/2012 | Hoshi | C03C 17/30 427/387 |
| 2004/0241976 | A1 | 12/2004 | Fukuhisa et al. | |
| 2008/0048240 | A1* | 2/2008 | Kamath | H01L 21/28518 257/315 |
| 2010/0289024 | A1* | 11/2010 | Ito | H01L 29/7869 257/59 |
| 2011/0266536 | A1* | 11/2011 | Bae | C23C 18/1216 257/43 |
| 2013/0101867 | A1* | 4/2013 | Yukinobu | C03C 17/006 428/702 |
| 2013/0196469 | A1* | 8/2013 | Facchetti | C23C 18/1216 438/104 |
| 2013/0240881 | A1* | 9/2013 | Nakamura | H01L 21/02554 257/43 |
| 2014/0299877 | A1* | 10/2014 | Nakamura | H01L 29/7869 257/43 |
| 2015/0011045 | A1* | 1/2015 | Kim | H01L 21/02554 438/104 |
| 2016/0013215 | A1* | 1/2016 | Ueda | C09D 5/24 345/204 |
| 2016/0042947 | A1* | 2/2016 | Nakamura | H01L 29/66969 257/43 |

FOREIGN PATENT DOCUMENTS

| | | |
|---|---|---|
| JP | 11-256342 | 9/1999 |
| JP | 2010-199402 | 9/2010 |
| WO | WO 03/031673 | 4/2003 |
| WO | WO 2011/155635 A1 | 12/2011 |

OTHER PUBLICATIONS

Masanori et al., Machine Translation of JP 11-256342, Sep. 1999, 10 pages.*

Aguilar-Frutis et al., "A Study of the Dielectriccharacteristics of aluminum oxide thin films deposited by spray pyrolysis from Al(acac)3", Thin Solid Films, 389, Feb. 2001, pp. 200-206.*

Kawaharamura et al., "Growth and electrical properties of AlOx grown by mist chemical vapor deposition", AIP Advances, 3, 032135, Mar. 2013, 9 pages.*

Translation of Written Opinion PCT/JP2014/066130, 7 pages.*

International Search Report dated Sep. 30, 2014, in corresponding International Application No. PCT/JP2014/066130.

International Search Report dated Sep. 30, 2014 in corresponding International Patent Application No. PCT/JP2014/066130.

* cited by examiner

METHOD FOR PRODUCING METAL OXIDE FILM AND METHOD FOR PRODUCING TRANSISTOR

CROSS-REFERENCE TO RELATED APPLICATIONS

This application is a continuation application filed under 35 U.S.C. §111(a), of International Application PCT/JP2014/066130, filed Jun. 18, 2014, which is based on and claims foreign priority benefit to Japanese Patent Application No. 2013-164248 filed Aug. 7, 2013, the contents of which are incorporated herein by reference.

TECHNICAL FIELD

The present invention relates to a method of producing a metal oxide film and a method of manufacturing a transistor.

BACKGROUND ART

A metal oxide, such as aluminum oxide or silicon oxide, is used in applications such as a semiconductor device and an optical thin film. It is desired that the metal oxide be formed into a film having a desired thickness at a desired place. When the metal oxide can be formed into a thin film more simply, low cost and high throughput are realized.

In Patent Literature 1, there is disclosed a film formation method including the steps of: forming, on a film forming surface of a substrate, a high-affinity region having high affinity for particles of a film forming material and a low-affinity region having affinity lower than that of the high-affinity region to the particles; and allowing the particles of a film forming material to fly onto the film forming surface by using a sputtering device having an electron capturing portion between the device and the substrate, to selectively deposit the film forming material on the high-affinity region.

CITATION LIST

Patent Literature

[PTL 1] Japanese Patent Laid-open Publication No. 2010-199402

SUMMARY OF INVENTION

Technical Problem

In the film formation method disclosed in Patent Literature 1, the film forming material is selectively deposited on the substrate by using the sputtering device. As described above, a technology for forming a metal oxide into a film by a dry method using a sputtering method or a vapor deposition method has been known. However, the dry method is mainly performed by using a vacuum device, and hence tends to entail high cost and low throughput as compared to a wet method.

In addition, a technology for selective metal oxide film formation through irradiation of a substrate with ultraviolet rays is widely used, but it is hard to say that such technology provides good adhesiveness to the substrate.

The present invention has been made in view of the above-mentioned circumstances, and an object of the present invention is to provide a technology for efficiently obtaining a metal oxide film having good adhesiveness.

Solution to Problem

Embodiments of the present invention have been made in order to achieve the above-mentioned object, and a method of producing a metal oxide film according to one embodiment of the present invention includes: an application step of applying a solution containing an organic metal complex onto a substrate; an ozone exposure step of exposing the resultant coating film to ozone; and a heating step of heating the coating film.

Further, in the method of producing a metal oxide film according to the embodiment of the present invention, the heating step may be performed at a heating temperature of 180° C. or less.

Further, the method of producing a metal oxide film according to the embodiment of the present invention may further include, after the ozone exposure step, a washing step of washing the substrate with an organic solvent, in which the ozone exposure step may include selectively exposing the coating film to ozone.

Further, the organic metal complex may include at least one kind of metal complex having a total carbon number of from 4 to 30 in one molecule.

Further, the organic metal complex may include an acetylacetonate metal complex, and a solvent in the solution containing an organic metal complex may include at least one kind selected from an alcohol, a ketone, an ether, a halogenated hydrocarbon, and a cyclic hydrocarbon.

Further, the metal oxide film may contain at least four elements of Al, O, C, and H, and a total composition ratio of C and H may be 70% or more with respect to the four elements.

Further, the organic solvent to be used in the washing step may include at least one kind selected from an alcohol, a ketone, an ether, a halogenated hydrocarbon, and a cyclic hydrocarbon.

Further, a method of manufacturing a transistor according to one embodiment of the present invention includes the steps of: forming a gate electrode on a substrate; applying a solution containing an organic metal complex onto the substrate; selectively exposing the resultant coating film to ozone; washing the substrate with an organic solvent; baking the coating film, to obtain an insulating film; and forming a source electrode, a drain electrode, and a semiconductor layer.

Further, a metal oxide film according to one embodiment of the present invention includes at least four elements of Al, O, C, and H, in which a total composition ratio of C and H is 70% or more with respect to the four elements.

Advantageous Effects of Invention

The technology for efficiently obtaining a metal oxide film having good adhesiveness can be provided.

DESCRIPTION OF EMBODIMENTS

An example according to one embodiment of the present invention is hereinafter described with reference to the drawings.

Figure 1:
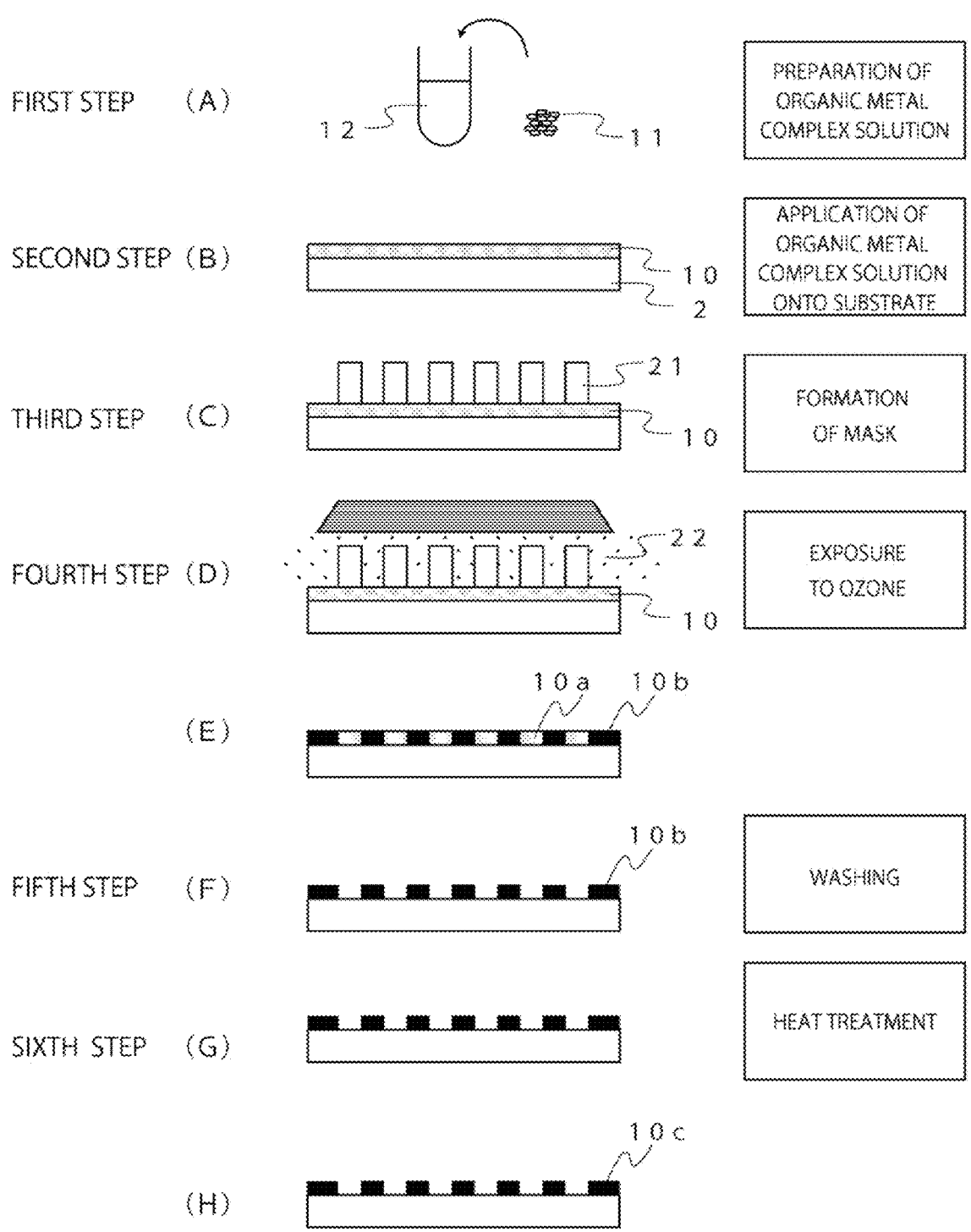
FIG. 1 are sectional views for illustrating an example of a method of producing a metal oxide film according to one embodiment of the present invention.

FIG. 1 are sectional views for illustrating an example of a method of producing a metal oxide film according to this embodiment.

(First Step)

First, as illustrated in FIG. 1(A), an organic metal complex solution 1 is prepared. The organic metal complex solution 1 is obtained by dissolving an organic metal complex 11 in a solvent 12. For example, the following metal acetylacetonate complex may be used as a material to be used for the organic metal complex 11: Cu(acac)2, Mn(acac)3, VO(acac)2, Fe(acac)3, Co(acac)3, or Zn(acac)2. It should be noted that "acac" represents acetylacetonate.

The solvent 12 may be any liquid in which the organic metal complex 11 is soluble. For example, the following solvent may be used: an alcohol such as ethanol, propanol, butanol, pentanol, hexanol, octanol, nonanol, benzyl alcohol, methylcyclohexanol, ethanediol, propanediol, butanediol, pentanediol, hexanediol, octanediol, or hexanetriol; an ester such as butyl formate, pentyl formate, methyl acetate, ethyl acetate, propyl acetate, butyl acetate, pentyl acetate, hexyl acetate, benzyl acetate, 3-methoxybutyl acetate, 2-ethylbutyl acetate, 2-ethylhexyl acetate, methyl propionate, ethyl propionate, propyl propionate, butyl propionate, or pentyl propionate; an amide such as dimethylformamide, dimethylacetamide, diethylformamide, or diethylacetamide; a ketone such as dimethyl ketone, methyl ethyl ketone, pentanone, hexanone, methyl isobutyl ketone, heptanone, or diisobutyl ketone; a nitrile such as acetonitrile; an ether such as diethyl ether, dipropyl ether, diisopropyl ether, dibutyl ether, or dihexyl ether; a cyclic ether such as anisole, tetrahydrofuran, or tetrahydropyran; an ethylene glycol ether such as dimethoxyethane, diethoxyethane, dibutoxyethane, diethylene glycol dimethyl ether, diethylene glycol diethyl ether, or ethylene glycol dibutyl ether; an acetal such as methylal or acetal; a paraffin-based hydrocarbon such as pentane, hexane, heptane, octane, nonane, decane, or dodecane; a cyclic hydrocarbon such as toluene, xylene, ethylbenzene, cumene, mesitylene, tetralin, butylbenzene, cymene, diethylbenzene, pentylbenzene, dipentylbenzene, cyclopentane, cyclohexane, methylcyclohexane, ethylcyclohexane, or decalin; or a halogenated hydrocarbon such as chloromethane, dichloromethane, trichloromethane (chloroform), tetrachloromethane, chloroethane, dichloroethane, trichloroethane, tetrachloroethane, pentachloroethane, chloropropane, dichloropropane, trichloropropane, chlorobutane, dichlorobutane, trichlorobutane, chloropentane, chlorobenzene, dichlorobenzene, chlorotoluene, dichlorotoluene, bromomethane, bromopropane, bromobenzene, or chlorobromoethane.

(Second Step)

Next, as illustrated in FIG. 1(B), the organic metal complex solution 1 is applied onto a substrate 2, to form a coating film 10. A generally used substrate material may be used as the substrate 2. For example, the following substrate may be used: a resin substrate of polyethylene terephthalate (PET), polyethylene naphthalate (PEN), polyimide, or the like; a semiconductor substrate of silicon (Si), gallium arsenide (GaAs), gallium nitride (GaN), or the like; or an oxide substrate of silicon dioxide ($SiO2$), sapphire, zinc oxide (ZnO), or the like.

It should be noted that a known application method may be used for the application of the organic metal complex solution 1. For example, the organic metal complex solution 1 is applied onto the substrate 2 by using an application method, such as a spin coating method, a dip coating method, or a spray method, to form the coating film 10. It should be noted that the application method is not limited to those methods, and other application methods may appropriately be selected depending on the uniformity, cost, and the like of the resultant film.

(Third Step)

Next, as illustrated in FIG. 1(C), a mask 21 having a desired opening pattern is prepared on the coating film 10 of the organic metal complex solution 1. For example, a metal mask, a patterned photoresist, or the like may be used as the mask 21. It should be noted that, in the case of using the metal mask, the mask may be placed so as to be brought into direct contact with the coating film 10, or may be placed with a space from the coating film 10 so as not to be brought into contact with the coating film 10. However, in this embodiment, the coating film 10 is exposed to ozone in accordance with the opening pattern of the mask in a fourth step described below, and hence when the mask 21 is placed so as to be brought into contact with the coating film 10, ozone can be prevented from entering a space between the coating film 10 and a non-opening portion of the mask 21, and a desired pattern tends to be obtained more easily. It should be noted that, in the case of using the patterned photoresist, the patterned photoresist may be obtained by forming a photoresist on the coating film 10 and conducting a general lithography step.

(Fourth Step)

Next, as illustrated in FIG. 1(D), the coating film 10 is exposed to ozone 22 through the mask 21. As an exposure method to the ozone 22, there is given, for example, a method involving exposure to the ozone 22 with an ozone cleaning device configured to generate ozone with light having a wavelength of about 250 mm or less included in ultraviolet light, a method involving exposure to the ozone 22 generated with an ozonizer or the like, or a method involving exposure to the ozone 22 with a plasma generator configured to generate ozone through a reaction between oxygen and plasma. The exposure method is appropriately selected based on the cost and throughput.

In FIG. 1(E), the substrate 2 obtained as a result of the exposure of the coating film 10 to the ozone 22 is illustrated. The coating film 10 is selectively covered with the mask 21 in the third step, and hence when the substrate 2 having formed thereon the coating film 10 is exposed to the ozone 22, a coating film 10a not exposed to the ozone 22 and a coating film 10b exposed to the ozone 22 are formed.

The coating film 10a not exposed to the ozone 22 has low resistance to an organic solvent because the organic metal complex 11 is soluble in an organic solvent, such as an alcohol or acetone. On the other hand, the coating film 10b exposed to the ozone 22 has high resistance to the organic solvent, such as an alcohol or acetone, because cleavage of a chemical bond or its rebinding occurs in the structure of the organic metal complex. That is, there arises a difference in solubility in the organic solvent between a portion exposed to the ozone 22 and a portion not exposed to the ozone 22 in the coating film 10.

(Fifth Step)

Next, as illustrated in FIG. 1(F), the substrate 2 having formed thereon the coating film 10a and the coating film 10b is washed by being brought into contact with an organic solvent. The organic solvent to be used for the washing may be any solvent in which the organic metal complex used in the first step is soluble. For example, the following solvent may be used in this case: an alcohol such as ethanol, propanol, butanol, pentanol, hexanol, octanol, nonanol, benzyl alcohol, methylcyclohexanol, ethanediol, propanediol, butanediol, pentanediol, hexanediol, octanediol, or hexanetriol; an ester such as butyl formate, pentyl formate, methyl acetate, ethyl acetate, propyl acetate, butyl acetate, pentyl acetate, hexyl acetate, benzyl acetate, 3-methoxybutyl acetate, 2-ethylbutyl acetate, 2-ethylhexyl acetate, methyl propionate, ethyl propionate, propyl propionate, butyl propionate, or pentyl propionate; an amide such as dimethylformamide, dimethylacetamide, diethylformamide, or diethylacetamide; a ketone such as dimethyl ketone, methyl ethyl ketone, pentanone, hexanone, methyl isobutyl ketone, heptanone, or diisobutyl ketone; a nitrile such as acetonitrile; an ether such as diethyl ether, dipropyl ether, diisopropyl ether, dibutyl ether, or dihexyl ether; a cyclic ether such as anisole, tetrahydrofuran, or tetrahydropyran; an ethylene glycol ether such as dimethoxyethane, diethoxyethane, dibutoxyethane, diethylene glycol dimethyl ether, diethylene glycol diethyl ether, or ethylene glycol dibutyl ether; an acetal such as methylal or acetal; a paraffin-based hydrocarbon such as pentane, hexane, heptane, octane, nonane, decane, or dodecane; a cyclic hydrocarbon such as toluene, xylene, ethylbenzene, cumene, mesitylene, tetralin, butylbenzene, cymene, diethylbenzene, pentylbenzene, dipentylbenzene, cyclopentane, cyclohexane, methylcyclohexane, ethylcyclohexane, or decalin; or a halogenated hydrocarbon such as chloromethane, dichloromethane, trichloromethane (chloroform), tetrachloromethane, chloroethane, dichloroethane, trichloroethane, tetrachloroethane, pentachloroethane, chloropropane, dichloropropane, trichloropropane, chlorobutane, dichlorobutane, trichlorobutane, chloropentane, chlorobenzene, dichlorobenzene, chlorotoluene, dichlorotoluene, bromomethane, bromopropane, bromobenzene, or chlorobromoethane. While the coating film 10a is dissolved through the washing because of low resistance to the organic solvent, the coating film 10b remains without being dissolved. Therefore, patterning is enabled based on the ozone-exposed portion and the ozone-unexposed portion. It should be noted that immersion in the organic solvent suffices for the washing, but the use of ultrasonic cleaning or stirring can shorten a treatment time period. It should be noted that a washing time period is appropriately set depending on the kinds of the organic metal complex and the organic solvent, because an excessively short washing time period may lead to insufficient dissolution of the coating film 10a, and in contrast, an excessively long washing time period may lead to dissolution of the coating film 10b.

(Sixth Step)

Next, as illustrated in FIG. 1(G), the coating film 10b is subjected to heat treatment (baked). It is desired that the heat treatment be performed at 180° C. or less because a high dielectric constant is obtained when the heating temperature is 180° C. or less. Through the heat treatment, a coating film 10c serving as a metal oxide film in which the coating film 10b has high adhesiveness to the substrate 2 is formed.

As a result of the heat treatment, as illustrated in FIG. 1(H), the metal oxide film which is patterned in the shape of the coating film 10c and has a high insulating property can be obtained.

As described above, in this embodiment, the selective metal oxide film can efficiently be obtained through the formation of the coating film by a wet method and its patterning through use of ozone. This eliminates the need for use of a strong acid, which is highly corrosive, as an etching solution for the patterning, and hence can prevent damage on wiring or the substrate.

(Modified Example)

Next, a modified example according to this embodiment is described.

Figure 2:
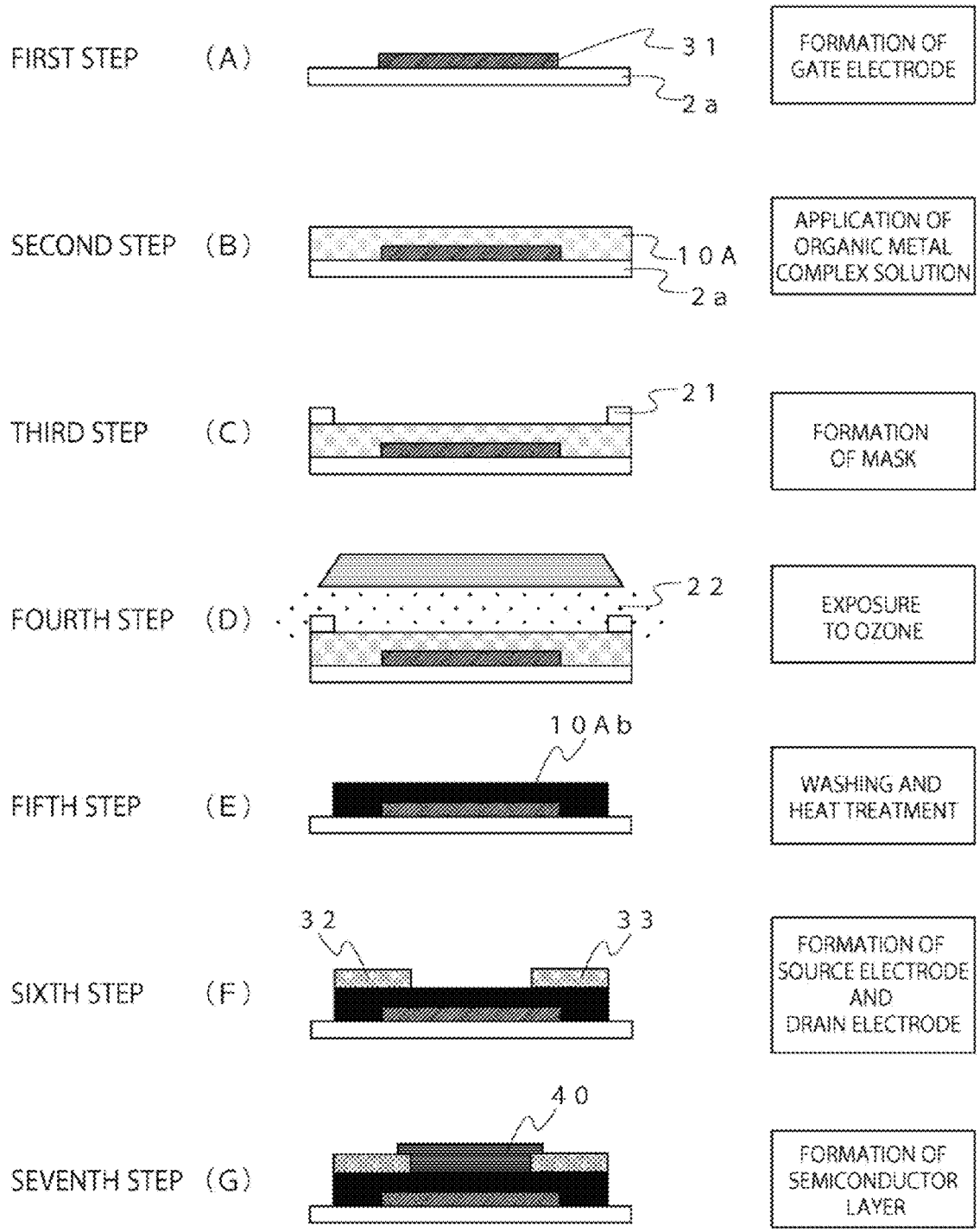
FIG. 2 are sectional views for illustrating an example of a method of producing a metal oxide film according to a modified example of the present invention.

FIG. 2 are sectional views for illustrating an example of a method of producing a metal oxide film according to this modified example. In this modified example, a transistor is manufactured by using the metal oxide film to be formed according to the above-mentioned embodiment.

(First Step)

First, as illustrated in FIG. 2(A), a gate electrode 31 is formed on a substrate 2a. The gate electrode is formed by using a known photolithography technology.

(Second Step)

Next, as illustrated in FIG. 2(B), the organic metal complex solution 1 prepared in the same manner as in the above-mentioned embodiment is applied, to forma coating film 10A. The coating film 10A serves as an insulating layer in the transistor later, and hence it is desired that the organic metal complex solution 1 be applied so as to coat the gate electrode 31.

(Third Step)

Next, as illustrated in FIG. 2(C), the mask 21 is prepared on the coating film of the organic metal complex solution 1. The mask 21 may be a metal mask, or the mask 21 may be formed by applying a resist and patterning the resist. It should be noted that the mask 21 may be formed so as to be brought into contact with the coating film 10A of the organic metal complex solution 1.

(Fourth Step)

Next, as illustrated in FIG. 2(D), the coating film 10A is exposed to the ozone 22. An exposure method is the same as in the above-mentioned embodiment.

(Fifth Step)

Next, as illustrated in FIG. 2(E), the coating film 10A is washed with an organic solvent in the same manner as in the above-mentioned embodiment. The organic solvent is acetone or the like as in the above-mentioned embodiment. Through the washing, a coating film 10Ab portion exposed to the ozone 22 remains on the substrate 2a, and an ozone-unexposed portion is dissolved. After that, the coating film 10Ab is subjected to heat treatment, to obtain an insulating film. It should be noted that, in the case of obtaining an aluminum oxide film as the insulating film, it is desired to set the heating temperature to 180° C. or less in order to obtain an insulating film having a high specific dielectric constant.

(Sixth Step)

Next, as illustrated in FIG. 2(F), a source electrode 32 and a drain electrode 33 are formed on the insulating film. The source electrode 32 and the drain electrode 33 are formed by using a known technology, such as photolithography, as in the case of the gate electrode.

(Seventh Step)

Next, as illustrated in FIG. 2(G), an organic or inorganic semiconductor layer 40 is formed on the substrate 2a by using a known technology.

According to this modified example, the insulating film having high adhesiveness can efficiently be obtained without using a strongly acidic organic solvent. In addition, the insulating film has a high specific dielectric constant as compared to a general insulating film, and hence is suitable as a gate insulating film in a transistor by virtue of high performance.

The embodiment of the present invention is hereinafter more specifically described by way of Examples. However, the present invention is not limited to the following Examples.

EXAMPLE 1

(Application)

First, 35 ml of ethanol (manufactured by Wako Pure Chemical Industries, Ltd.) was added to 0.003 mol of aluminum acetylacetonate (manufactured by Tokyo Chemical Industry Co., Ltd.), and the resultant was stirred well. Then, it was confirmed that aluminum acetylacetonate was fully dissolved. The organic metal complex solution 1, which was the resultant mixed solution, was dropped onto the substrate 2 formed of Si, and applied by spin coating with a spin coater at a number of revolutions of 700 rpm for 30 seconds.

(Exposure to Ozone and Washing)

After that, a metal mask was placed on the resultant sample, and the sample was exposed to ozone with a UV ozone cleaning device (OC-2506: manufactured by Iwasaki Electric Co., Ltd.) for 10 minutes. The metal mask has a shape of a line and space pattern having a line width and a space width of 200 μm. After the exposure to ozone, there was a difference in contrast between an exposed portion and an unexposed portion, and a phase change was expected to have occurred. After the exposure to ozone, the sample was immersed in acetone serving as an organic solvent, and left to stand for 5 minutes. After that, the sample was taken out of acetone, and blown with an air gun, washed with ethanol and distilled water in this order, and air-blown.

(Heat Treatment)

After that, the resultant sample was heated and baked at 150° C. Thus, an aluminum oxide film was able to be formed as the coating film 10c, and a shape of the same line and space pattern as that of the metal mask was able to be formed.

(Evaluation)

Figure 3:
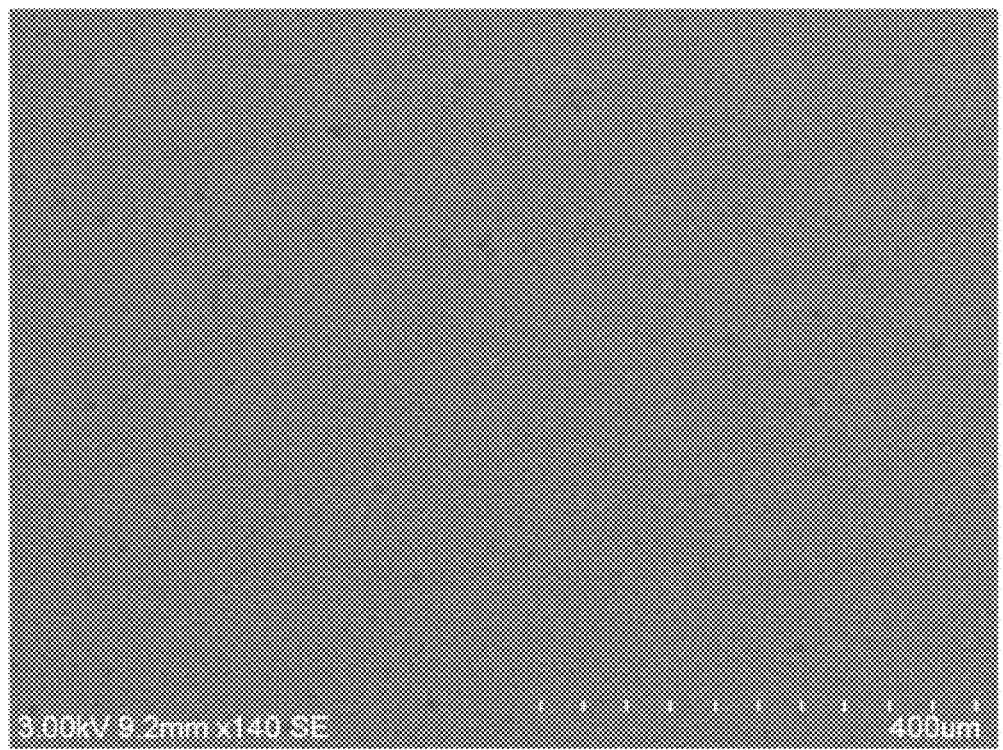
FIG. 3 is a SEM image of an obtained aluminum oxide film at a magnification of 140 times.

FIG. 3 is a SEM image of the resultant aluminum oxide film at a magnification of 140 times. It was revealed that the coating film was uniformly formed without a defect and a crack.

Figure 4:
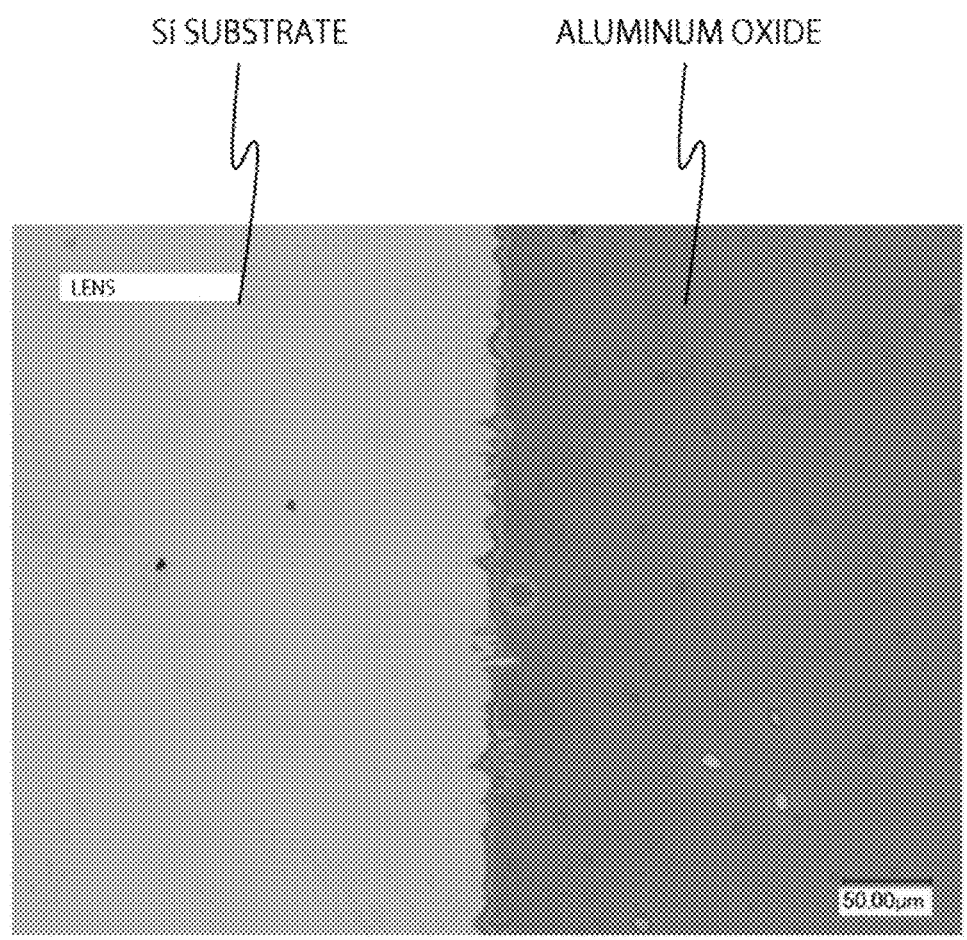
FIG. 4 is an optical micrograph of the obtained aluminum oxide film at a magnification of 600 times.

FIG. 4 is an optical micrograph of the resultant aluminum oxide film at a magnification of 600 times. In FIG. 4, an area of the Si substrate is shown in the left side and an area of the aluminum oxide film is shown in the right side. A boundary between the aluminum oxide film and the Si substrate was able to be confirmed in the optical micrograph of FIG. 4. The film thickness of the film was measured with a stylus profiler (P16+: manufactured by Tencor) through use of the resultant difference in level, and as a result, it was found that the film thickness was 50 nm.

Figure 5:
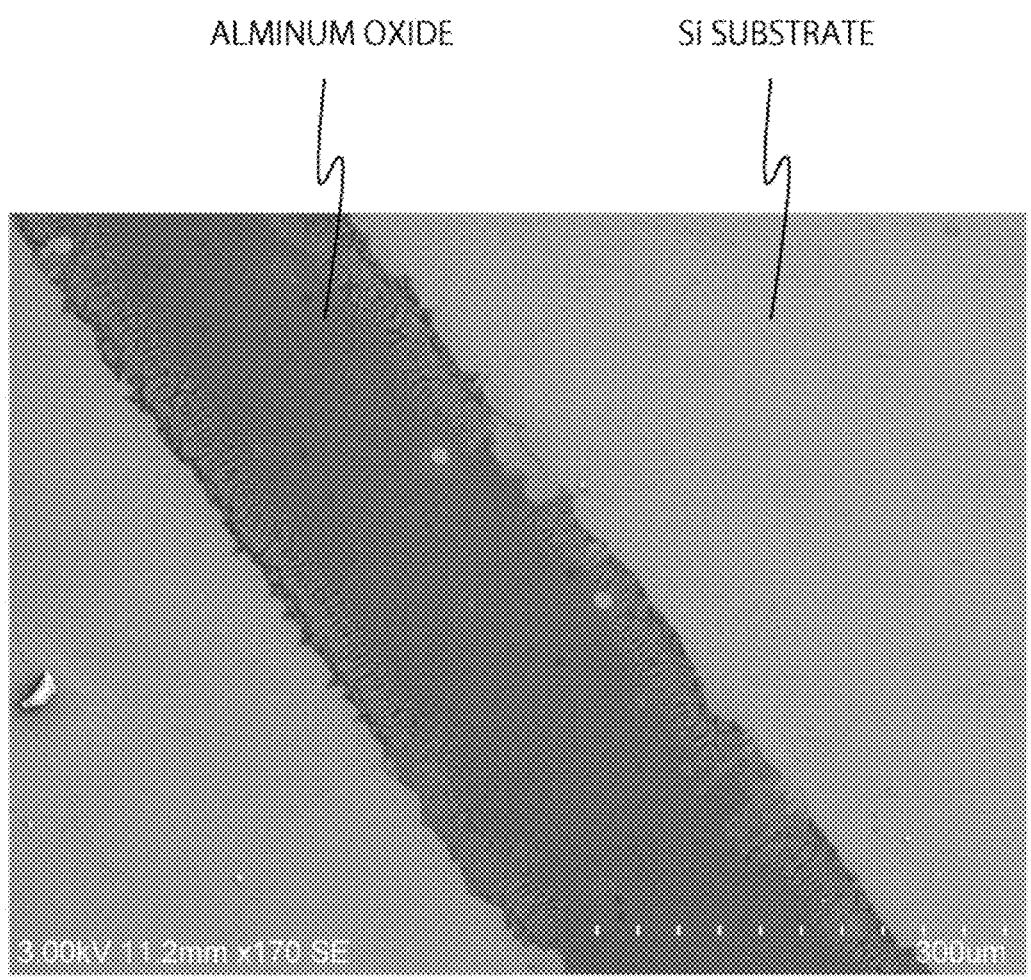
FIG. 5 is a SEM image of the line and space pattern of the aluminum oxide film at a magnification of 170 times.

FIG. 5 is a SEM image of the line and space pattern of the aluminum oxide film at a magnification of 170 times. The area extending longitudinally through the center of FIG. 5 is the area of the aluminum oxide film, and any other portion is the area of the Si substrate. It was revealed that the same line and space pattern having a line width and a space width of 200 μm as that of a shadow mask was formed, and the patterning was successful.

Figure 6:
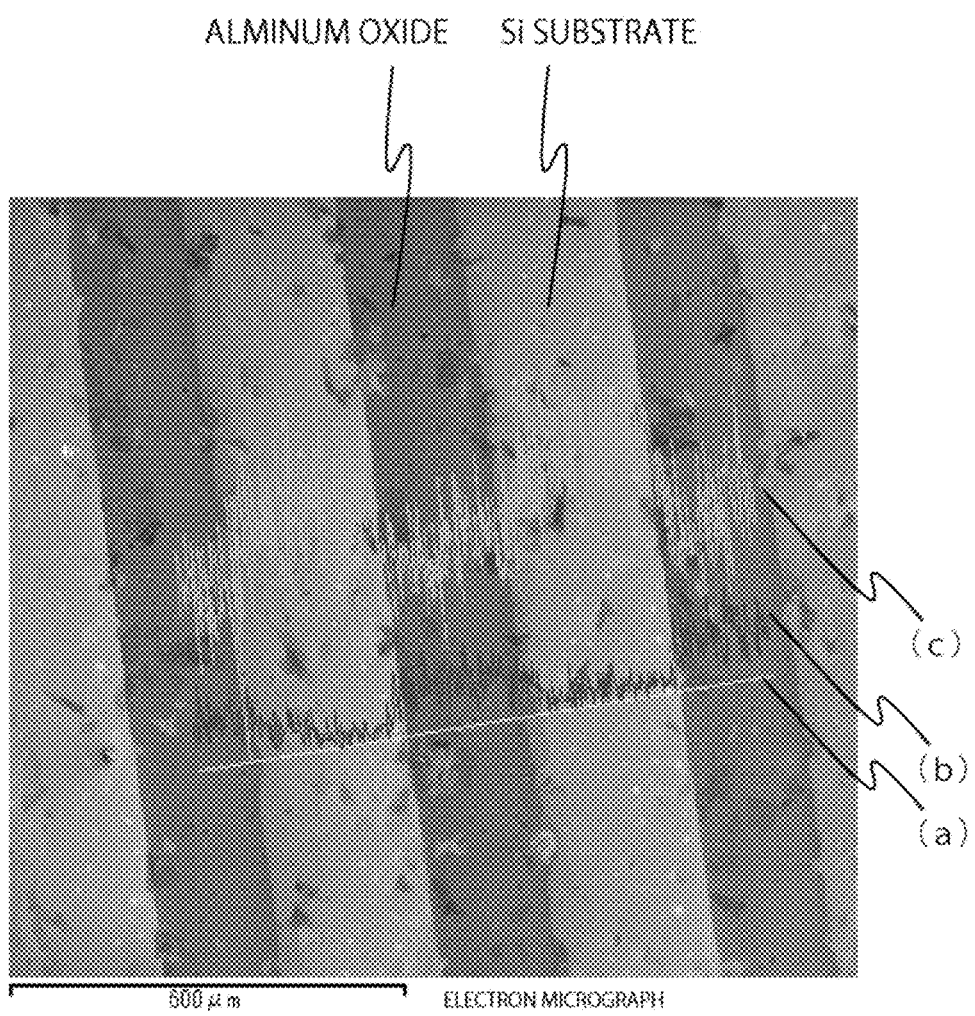
FIG. 6 is an image for showing a SEM image of the line and space pattern of the aluminum oxide film at a magnification of 100 times and line scan results obtained by EDX.

FIG. 6 is an image for showing a SEM image of the line and space pattern of the aluminum oxide film at a magnification of 100 times and line scan results obtained by energy dispersive X-ray spectrometry (EDX). A line scan was performed along the line (a) to perform elemental analysis of Al and Si derived from the substrate. It was revealed that, according to the line (b), Al derived from the aluminum oxide film was detected in the ozone-exposed portion, and according to the line (c), Si derived from the Si substrate was detected in the ozone-unexposed portion. With this, it was able to be judged that the pattern was able to be formed.

As described above, it was able to be confirmed that the metal oxide film was able to be formed by a wet method, and the patterned film was able to be formed simply without using an etching solution of a fluoride or the like.

EXAMPLE 2

Aluminum acetylacetonate was prepared as the organic metal complex 11 in the same manner as in Example 1, and the organic metal complex solution 1 was prepared by using ethanol in the same manner as in Example 1. The organic metal complex solution 1 was applied onto the substrate 2, followed by exposure to ozone. After that, unlike Example 1, the resultant was baked at 150° C. for 10 minutes without the washing serving as the fifth step described above.

Figure 7:
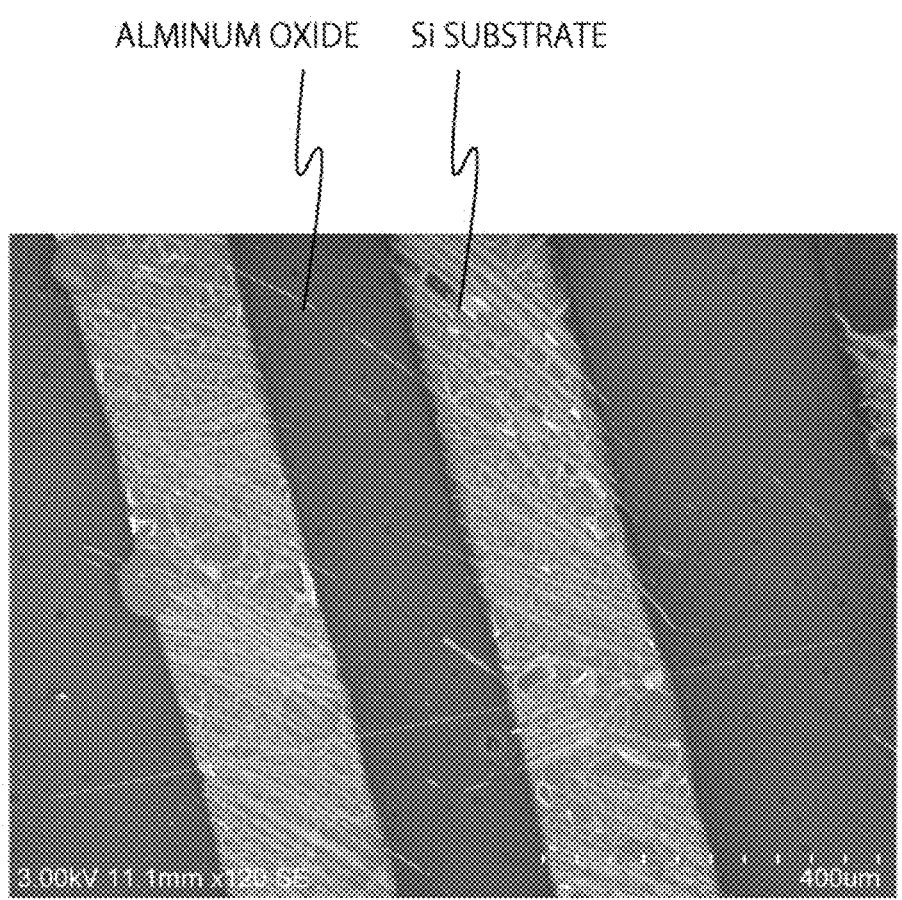
FIG. 7 is a SEM image of an obtained aluminum oxide film at a magnification of 120 times.

FIG. 7 is a SEM image of the resultant aluminum oxide film at a magnification of 120 times. As apparent from the result, a line and space pattern was able to be formed based on an ozone-exposed portion and an ozone-unexposed portion. The line and space pattern was formed because, in the coating film 10a corresponding to the ozone-unexposed portion, sublimation was observed to some extent in the heating step without the washing step.

Figure 8:
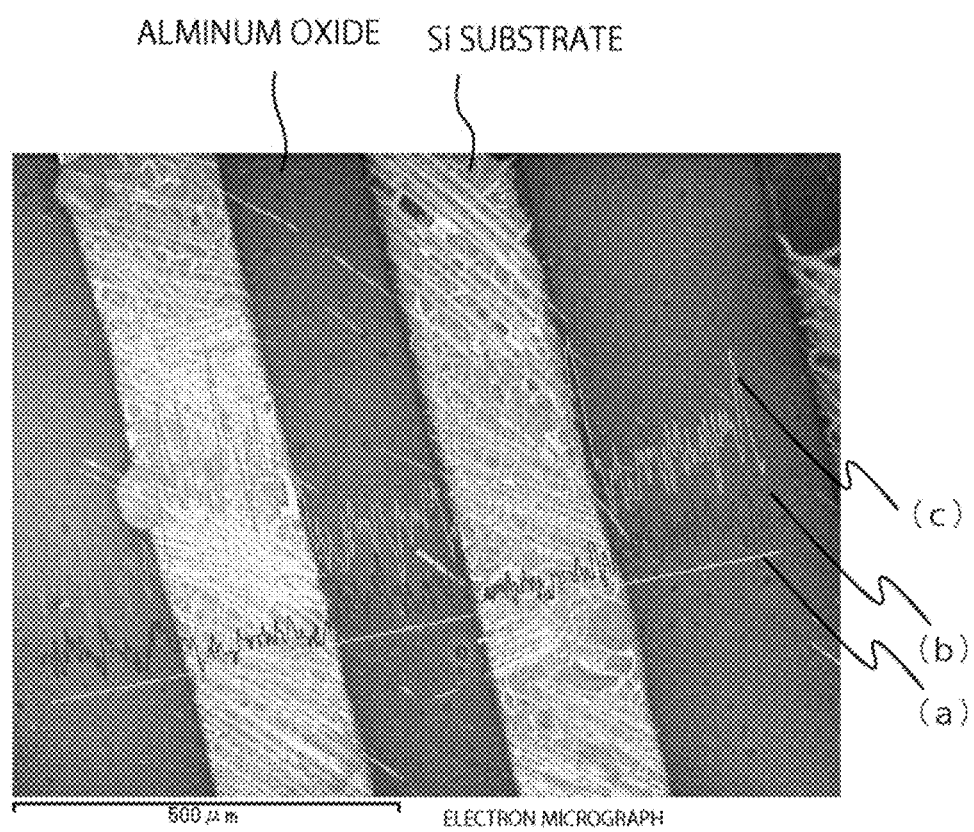
FIG. 8 is an image for showing a SEM image of the line and space pattern of the aluminum oxide film at a magnification of 120 times and line scan results obtained by EDX.

FIG. 8 is an image for showing a SEM image of the line and space pattern of the aluminum oxide film at a magnification of 120 times and line scan results obtained by EDX. With regard to the line scan, Al and Si were scanned in the same manner as in Example 1. The line (b), which represented the scan result of Al, revealed that there was a difference in Al detection amount between the ozone-exposed portion and the ozone-unexposed portion. A difference in film thickness between a line and a space was measured with a profiler, and as a result, it was found that the difference was 50 nm as in Example 1. However, unlike the sample of Example 1, a residue was observed because the washing with an organic solvent was not performed during the process.

Figure 9:
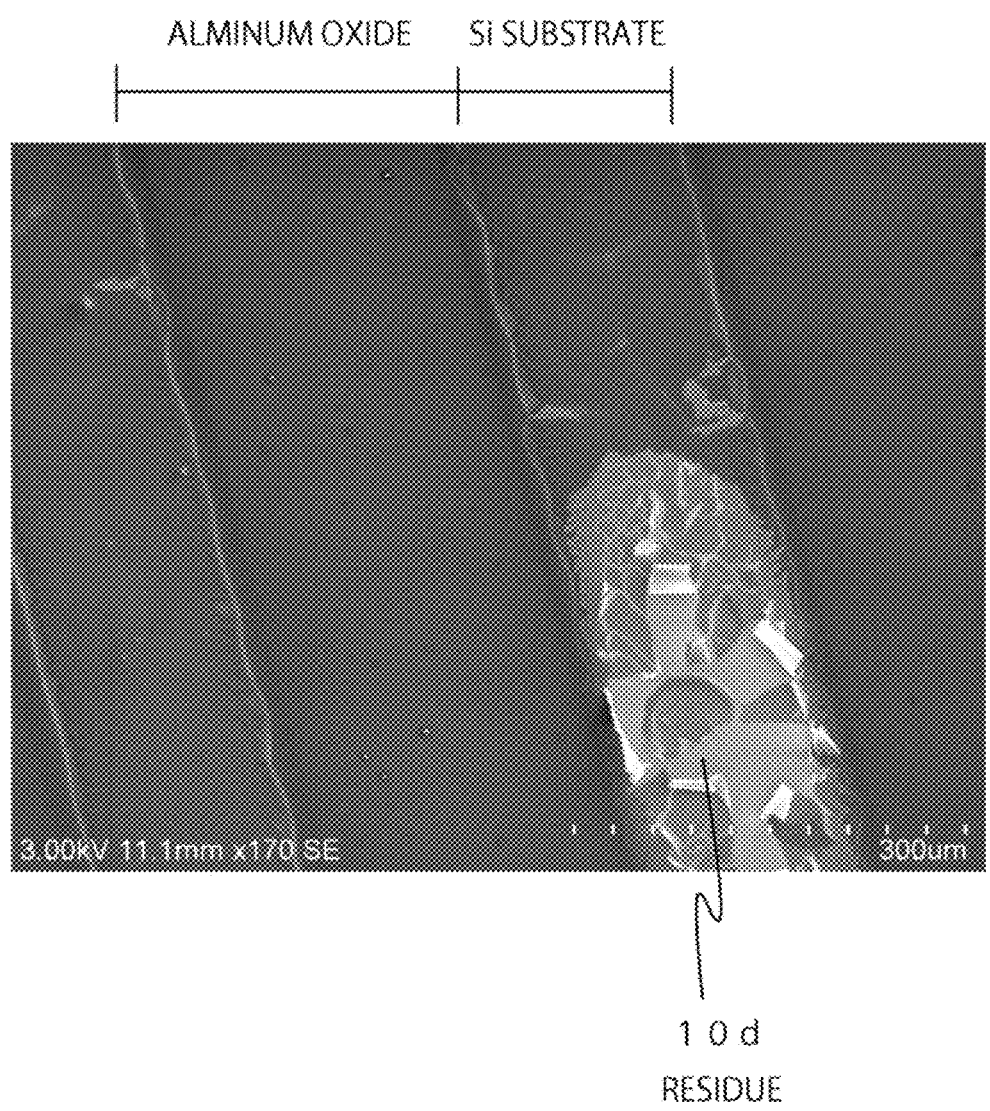
FIG. 9 is a SEM image of the aluminum oxide film at a magnification of 170 times.

FIG. 9 is a SEM image of the aluminum oxide film at a magnification of 170 times. A residue 10*d* represents the residue remaining on the Si substrate. It was revealed that the coating film 10*a* was not fully sublimated even in the ozone-unexposed portion, and the residue 10*d* remained in some portions.

In this Example, the washing with an organic solvent was performed after the baking in order to remove the residue 10*d*. The substrate 2 in the state shown in FIG. 8 was immersed in acetone for 5 minutes, and dried with a blower.

Figure 10:
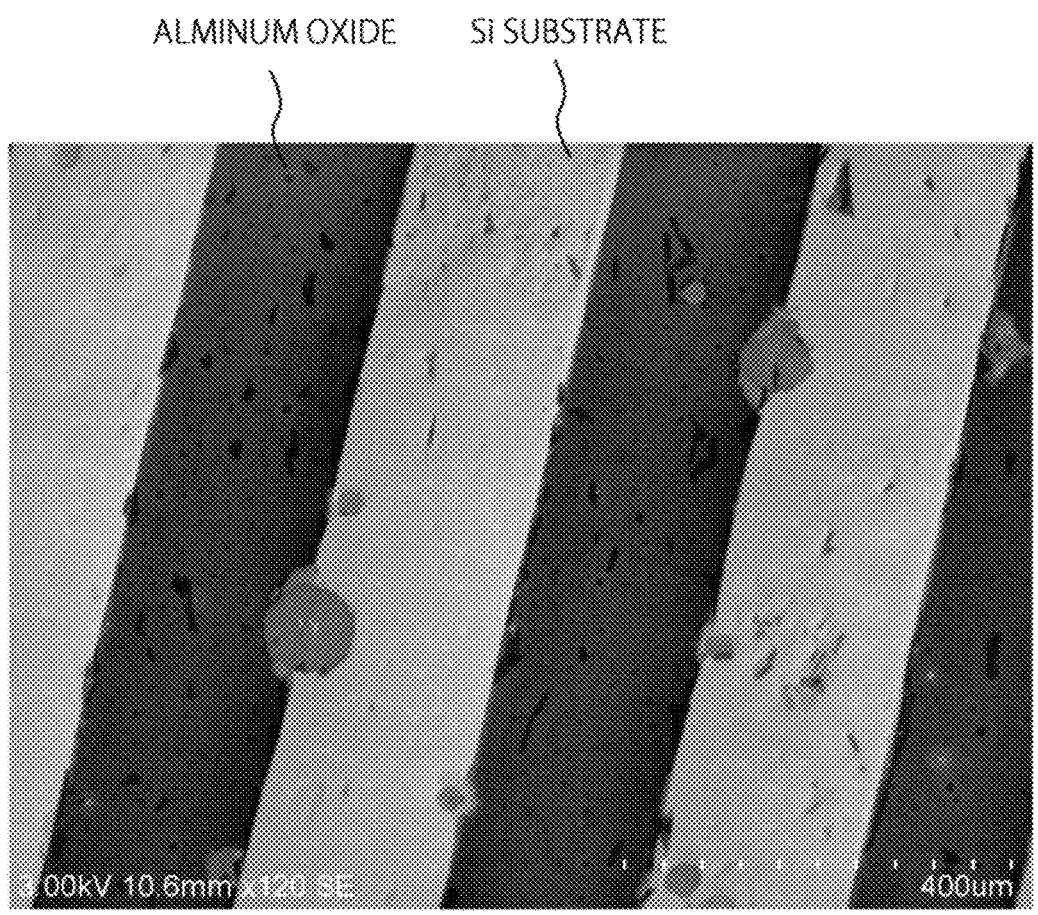
FIG. 10 is a SEM image of an obtained aluminum oxide film at a magnification of 120 times.

FIG. 10 is a SEM image of the resultant aluminum oxide film at a magnification of 120 times.

Figure 11:
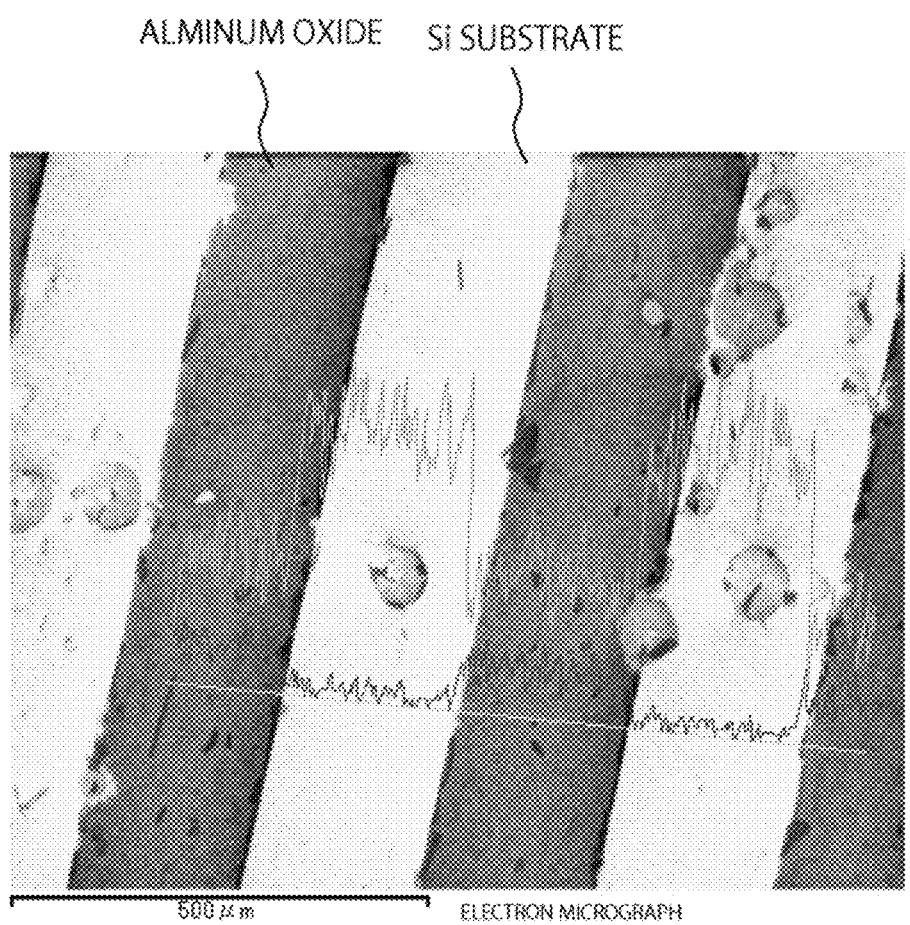
FIG. 11 is an image for showing the SEM image of the obtained aluminum oxide film at a magnification of 120 times and line scan results obtained by EDX.

FIG. 11 is an image for showing the SEM image of the resultant aluminum oxide film at a magnification of 120 times and line scan results obtained by EDX. It was revealed that contrast between Al and the Si substrate was increased, and the residue was reduced.

EXAMPLE 3

Aluminum acetylacetonate was prepared as the organic metal complex 11 in the same manner as in Example 1, and the organic metal complex solution 1 was prepared by using ethanol, and applied onto the substrate 2, followed by exposure to ozone, in the same manner as in Example 1. After that, the resultant was washed with ethanol for the purpose of removing an ozone-unexposed portion, and then baked at 150° C. It was confirmed from a SEM image that an ozone-exposed portion remained and only the ozone-unexposed portion was selectively removed, resulting in a patterned metal oxide film, as in Example 1.

EXAMPLE 4

Aluminum acetylacetonate was prepared as the organic metal complex 11 in the same manner as in Example 1. The organic metal complex solution 1 was prepared by dissolving the organic metal complex 11 through use of 35 ml of acetone as a solvent for dissolving the organic metal complex 11. Next, the organic metal complex solution 1 was applied onto the substrate 2, followed by exposure to ozone, in the same manner as in Example 1. After that, the resultant was washed with acetone for the purpose of removing an ozone-unexposed portion, and then baked at 150° C. It was confirmed from a SEM image that an ozone-exposed portion remained on the substrate 2 and the ozone-unexposed portion was removed, resulting in a patterned metal oxide film, as in Example 1.

EXAMPLE 5

Aluminum acetylacetonate was prepared as the organic metal complex 11 in the same manner as in Example 1, and 35 ml of acetone was used as a solvent for dissolving the organic metal complex 11. The organic metal complex solution 1 was prepared by dissolving the organic metal complex 11. Next, the organic metal complex solution 1 was applied onto the substrate 2, followed by exposure to ozone, in the same manner as in Example 1. After that, the resultant was washed with ethanol for the purpose of removing an ozone-unexposed portion, and then baked at 150° C. It was confirmed from a SEM image that an ozone-exposed portion remained on the substrate 2 and the ozone-unexposed portion was removed, resulting in a patterned metal oxide film, as in Example 1.

EXAMPLE 6

Aluminum acetylacetonate was prepared as the organic metal complex 11 in the same manner as in Example 1, and 15 ml of toluene was used as a solvent for dissolving the organic metal complex 11. The organic metal complex solution 1 was prepared by dissolving the organic metal complex 11. Next, the organic metal complex solution 1 was applied onto the substrate 2, followed by exposure to ozone, in the same manner as in Example 1. After that, the resultant was washed with acetone for the purpose of removing an ozone-unexposed portion, and then baked at 150° C. It was confirmed from a SEM image that an ozone-exposed portion remained on the substrate 2 and the ozone-unexposed portion was removed, resulting in a patterned metal oxide film, as in Example 1.

EXAMPLE 7

Aluminum acetylacetonate was prepared as the organic metal complex 11 in the same manner as in Example 1, and 35 ml of chloroform was used as a solvent for dissolving the organic metal complex 11. The organic metal complex solution 1 was prepared by dissolving the organic metal complex 11. Next, the organic metal complex solution 1 was applied onto the substrate 2, followed by exposure to ozone, in the same manner as in Example 1. After that, the resultant was washed with acetone for the purpose of removing an ozone-unexposed portion, and then baked at 150° C. It was confirmed from a SEM image that an ozone-exposed portion remained on the substrate 2 and the ozone-unexposed portion was removed, resulting in a patterned metal oxide film, as in Example 1.

COMPARATIVE EXAMPLE

Aluminum acetylacetonate was prepared as the organic metal complex 11 in the same manner as in Example 1, and the organic metal complex solution 1 was prepared by using ethanol as a solvent, and applied onto the substrate 2, followed by exposure to ozone, in the same manner as in Example 1. After that, water was used for the purpose of removing an ozone-unexposed portion. As a result, unlike other Examples, the coating film was removed in an ozone-exposed portion as well as in the ozone unexposed portion. From this Comparative Example, it was revealed that the washing with an inorganic solution containing water made it difficult to pattern a metal oxide film, and hence the use of an organic solvent without water was suitable for the washing.

EXAMPLE 8

0.003 mol of zinc acetylacetonate (manufactured by Tokyo Chemical Industry Co., Ltd.) was used as the organic metal complex 11, and 35 ml of ethanol was used as a solvent. The organic metal complex 11 was dissolved in the solvent, to prepare the organic metal complex solution 1. After that, the organic metal complex solution 1 was applied onto the substrate 2, followed by exposure to ozone, washing with acetone, and baking at 150° C., in the same manner as in Example 1. As a result, a SEM image of a line and space pattern was obtained, and the shape of the pattern of a zinc oxide film was able to be confirmed.

EXAMPLE 9

Adjustment of Heating Temperature

Aluminum acetylacetonate was prepared as the organic metal complex 11 in the same manner as in Example 1, and the organic metal complex solution 1 was prepared by using ethanol as the solvent 12 in the same manner as in Example 1. The organic metal complex solution 1 was applied onto the substrate 2 so as to achieve a film thickness of 200 nm. Next, the coating film was washed with acetone for the purpose of removing fine dust adhering onto the coating film. Next, the coating film was exposed to ozone by the same method as in Example 1 without patterning with a mask. After that, the resultant was subjected to baking of several patterns within a range of from 120° C. to 200° C. After the baking, a gold electrode having a diameter of 2 mm was formed on the resultant aluminum oxide film by a sputtering method, and the electrical characteristics of the film were measured by using the substrate 2 and the gold electrode as upper and lower electrodes, respectively. A semiconductor parameter analyzer (4200-SCS: manufactured by Keithley) was used for the measurement.

Figure 12:
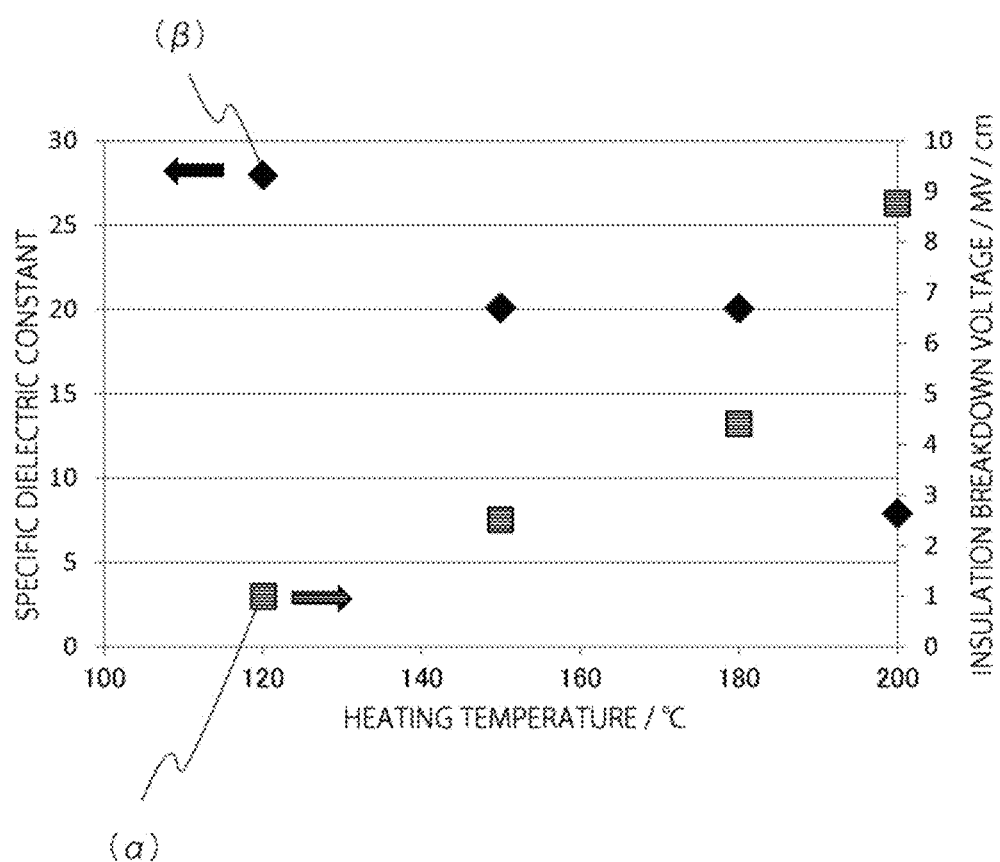
FIG. 12 is a graph for showing measurement results of heating temperature and a specific dielectric constant/insulation breakdown voltage.

FIG. 12 is a graph for showing measurement results of heating temperature and a specific dielectric constant/insulation breakdown voltage. The symbol represented by α represents the relationship between the heating temperature and the insulation breakdown voltage, and the symbol represented by β represents the relationship between the heating temperature and the specific dielectric constant. In addition, the numerical values of the measurement results shown in FIG. 12 are shown in Table 1 below.

TABLE 1

| Sample | Heating temperature (° C.) | Specific dielectric constant | Insulation breakdown voltage (MV/cm) |
|---|---|---|---|
| No. 1 | 120 | 28 | 1 |
| No. 2 | 150 | 20 | 2.5 |
| No. 3 | 180 | 20 | 4.4 |
| No. 4 | 200 | 8 | 8.75 |

While general aluminum oxide had a specific dielectric constant of 10 or less, it was revealed, with reference to the symbol represented by β, that the specific dielectric constant tended to be higher than that of general aluminum oxide within a heating temperature range of 180° C. or less.

The results indicate that the aluminum oxide of this Example has a composition different from its stoichiometric composition. From the fact that the specific dielectric constant is higher than that of general aluminum oxide, it can be said that the aluminum oxide according to this Example is suitable for use as a gate insulating film in a transistor or the like.

EXAMPLE 10

Aluminum acetylacetonate was prepared as the organic metal complex 11 in the same manner as in Example 1, and the organic metal complex solution 1 was prepared by using isopropyl alcohol as a solvent. The organic metal complex solution 1 was applied onto the substrate 2, followed by exposure to ozone, in the same manner as in Example 1. After that, unlike Example 1, the resultant was subjected to heat treatment at different temperatures of four patterns without the washing serving as the fifth step. As a result, four kinds of aluminum oxide films subjected to heat treatment at 120° C., 150° C., 180° C., and 200° C. were obtained.

The aluminum oxide films obtained were each measured for a composition ratio (relative value) among four elements of Al, O, C, and H by Rutherford backscattering spectrometry (RBS), hydrogen forward scattering spectrometry (HFS), and nuclear reaction analysis (NRA).

Figure 13:
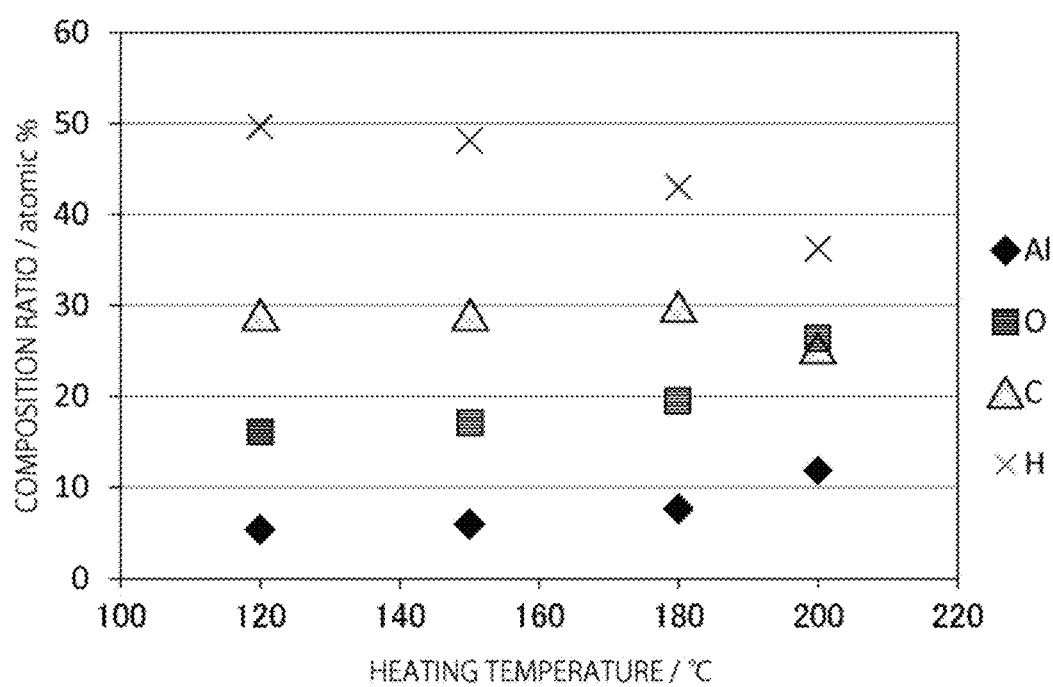
FIG. 13 is a graph for showing measurement results of the heating temperature of an aluminum oxide film and its composition ratio.

FIG. 13 is a graph for showing the measurement results of the heating temperature of the aluminum oxide film and the composition ratio. In addition, the numerical values of the measurement results shown in FIG. 13 are shown in Table 2 below.

TABLE 2

| Sample | Heating temperature (° C.) | Al (atomic %) | O (atomic %) | C (atomic %) | H (atomic %) |
|---|---|---|---|---|---|
| No. 5 | 120 | 5.4 | 16.1 | 28.9 | 49.6 |
| No. 6 | 150 | 6 | 17.1 | 28.8 | 48.1 |
| No. 7 | 180 | 7.6 | 19.5 | 29.9 | 43 |
| No. 8 | 200 | 11.9 | 26.4 | 25.3 | 36.2 |

With reference to FIG. 13, it is revealed that, as the heating temperature is increased more, the total composition ratio of H and C is reduced more, and the total composition ratio of Al and O is increased more. From the results, it is considered that a hydrocarbon (CH) bond derived from the organic metal complex 11 disappears with an increase in heating temperature.

The results of <Example 9> and <Example 10> are discussed. While the specific dielectric constant tended to be higher than that of general aluminum oxide in the heating temperature range of 180° C. or less in <Example 9>, according to <Example 10>, the total composition ratio of C and H was reduced in the heating temperature range of 180° C. or more. Accordingly, it is considered that the high specific dielectric constant in the heating temperature range of 180° C. or less results from the CH bond, and a higher specific dielectric constant is obtained when the number of CH bonds in the coating film 10 becomes larger. In other words, when the heating is performed at a heating temperature of 200° C. or more, an aluminum oxide film as obtained in the related art is obtained, but the aluminum oxide film obtained does not exhibit a high specific dielectric constant.

In addition, according to <Example 10> and Table 2, the total composition ratio of C and H is 70% or more within the heating temperature range of 180° C. or less, within which a high dielectric constant is exhibited in <Example 9>. That is, it is revealed that the aluminum oxide film exhibiting a high dielectric constant is obtained in the case where the total composition ratio of C and H is 70% or more with respect to the four elements of Al, O, C, and H in the aluminum oxide film.

REFERENCE SIGNS LIST

1: organic metal complex solution, 2, 2a: substrate, 10, 10A, 10a, 10b, 10Ab: coating film, 11: organic metal complex, 12: solvent, 31: gate electrode, 32: source electrode, 33: drain electrode, 40: semiconductor layer

The invention claimed is:

1. A method of producing a metal oxide film, the method comprising:
   an application step of applying a solution containing an organic metal complex onto a substrate to form a resultant coating film;
   an ozone exposure step of exposing the resultant coating film to ozone; and a heating step of heating the resultant coating film that was exposed to the ozone to form the metal oxide film, wherein the heating is performed at a heating temperature of 180° C. or less.

2. The method of producing the metal oxide film according to claim 1, wherein the ozone exposure step comprises selectively exposing the resultant coating film to the ozone, and the method further comprises, after the ozone exposure step, a washing step of bringing the resultant coating film that was selectively exposed to the ozone into contact with an organic solvent.

3. The method of producing the metal oxide film according to claim 1, wherein the organic metal complex comprises at least one kind of metal complex having a total carbon number of from 4 to 30 in one molecule.

4. The method of producing the metal oxide film according to claim 1, wherein:

the organic metal complex comprises an acetylacetonate metal complex; and a solvent in the solution containing the organic metal complex comprises at least one kind selected from an alcohol, a ketone, an ether, a halogenated hydrocarbon, and a cyclic hydrocarbon.

5. The method of producing the metal oxide film according to claim 1, wherein the metal oxide film contains at least four elements of Al, O, C, and H, and a total composition ratio of C and H is 70% or more with respect to the four elements.

6. The method of producing the metal oxide film according to claim 2, wherein the organic solvent to be used in the washing step comprises at least one kind selected from an alcohol, a ketone, an ether, a halogenated hydrocarbon, and a cyclic hydrocarbon.

7. A method of manufacturing a transistor, the method comprising:

forming a gate electrode on a substrate;

applying a solution containing an organic metal complex onto the substrate to form a resultant coating film;

selectively exposing the resultant coating film to ozone;

washing the substrate with an organic solvent;

baking the resultant coating film that was selectively exposed to the ozone, to obtain an insulating film, wherein the baking is performed at a baking temperature of 180° C. or less; and forming a source electrode, a drain electrode, and a semiconductor layer.

* * * * *